United States Patent [19]
Moriyama

[11] Patent Number: 5,496,777
[45] Date of Patent: Mar. 5, 1996

[54] METHOD OF ARRANGING ALIGNMENT MARKS

[75] Inventor: Norio Moriyama, Tokyo, Japan

[73] Assignee: Oki Electric Industry Co., Ltd., Tokyo, Japan

[21] Appl. No.: 293,148

[22] Filed: Aug. 19, 1994

[30] Foreign Application Priority Data

Aug. 26, 1993 [JP] Japan .................................. 5-234144

[51] Int. Cl.⁶ ............................................. H01L 21/461
[52] U.S. Cl. ................. 437/249; 437/924; 148/DIG. 102
[58] Field of Search ............................. 437/924, 8, 249, 437/226, 227; 148/DIG. 102, DIG. 28; 257/797

[56] References Cited

U.S. PATENT DOCUMENTS

| | | |
|---|---|---|
| 4,233,091 | 11/1980 | Kawabe . |
| 5,314,837 | 5/1994 | Barber et al. ............................ 437/924 |
| 5,316,984 | 5/1994 | Leourx ..................................... 437/924 |

FOREIGN PATENT DOCUMENTS

| | | | |
|---|---|---|---|
| 60-35514 | 2/1985 | Japan . | |
| 61-141137 | 6/1986 | Japan ..................................... | 437/924 |
| 61-166129 | 7/1986 | Japan ..................................... | 437/924 |
| 61-185927 | 8/1986 | Japan . | |
| 61-240646 | 10/1986 | Japan ..................................... | 437/924 |
| 62-273724 | 11/1987 | Japan ..................................... | 437/924 |
| 62-298133 | 12/1987 | Japan . | |
| 1-73733 | 3/1989 | Japan ..................................... | 257/797 |
| 1-276737 | 11/1989 | Japan . | |
| 2-65153 | 3/1990 | Japan ..................................... | 257/797 |

OTHER PUBLICATIONS

S. Wolf, "Silicon Processing For the VLSI EVA" Lattice Press 1990, pp. 196–198, vol. II.

*Primary Examiner*—Brian E. Hearn
*Assistant Examiner*—Leon Radomsky
*Attorney, Agent, or Firm*—Wenderoth, Lind & Ponack

[57] ABSTRACT

Alignment marks used in different processes are arranged on scribing lines. The scribing lines are used for cutting off individual semiconductor devices formed on a wafer, and the alignment marks have widths which are larger than widths of the scribing lines. The width of areas corresponding to position where alignment marks are formed area enlarged so as to accommodate the alignment marks within the areas. A part of the area a used alignment mark is covered with a new film so that the area is permitted to have a scribing line having a desired width every time a used alignment is generated. A new alignment mark is arranged within other areas where an alignment mark is not formed. In such an arrangement of the alignment marks, the center line of the scribing line is made clear and the area where the semiconductor devices are formed can be made large.

12 Claims, 6 Drawing Sheets

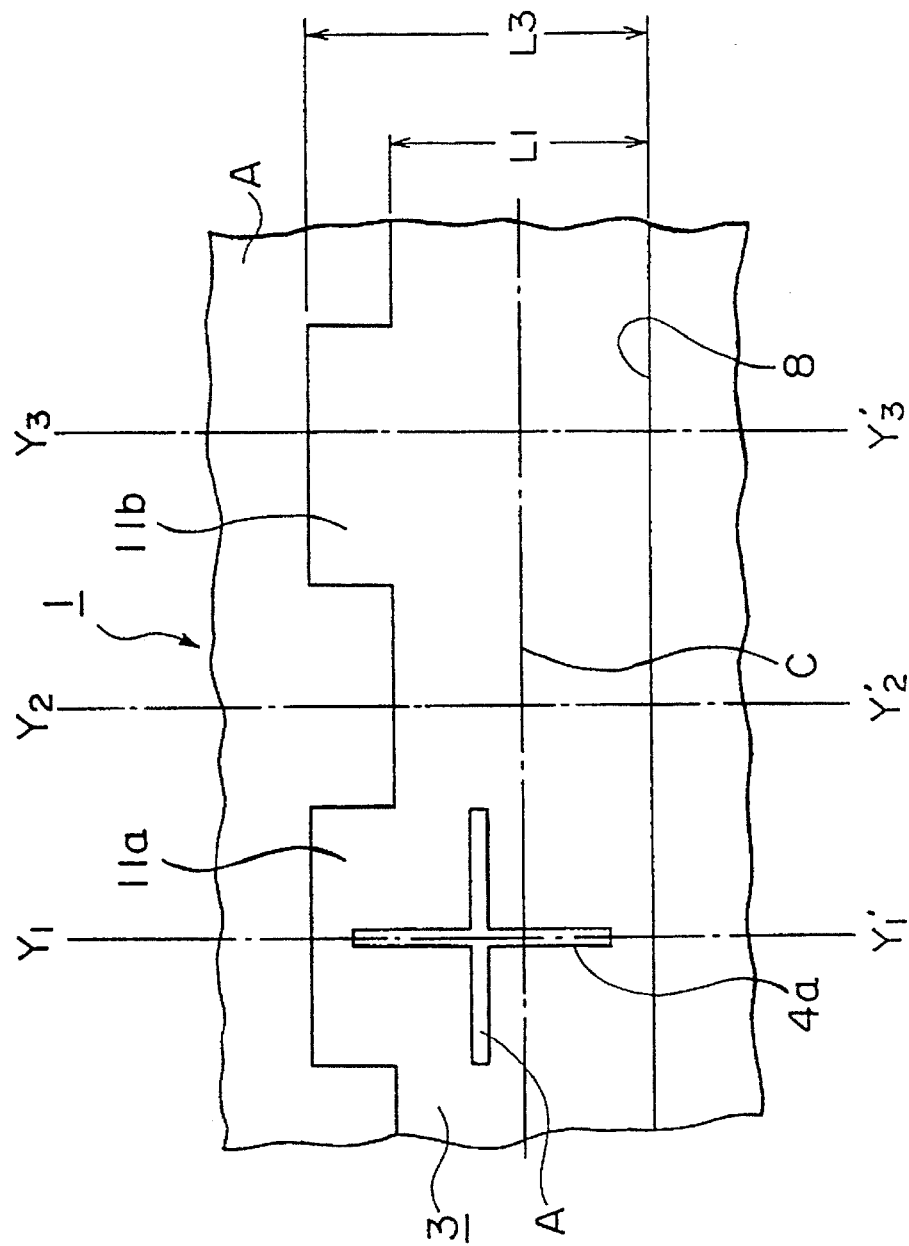

5,496,777

METHOD OF ARRANGING ALIGNMENT MARKS

BACKGROUND OF THE INVENTION

1. Field of the Invention

The present invention relates to a method of arranging alignment marks for use in a manufacturing process of a semiconductor device, particularly for use in aligning alignment marks on a wafer of the semiconductor device.

2. Prior Art

There are many processes which require alignment of alignment marks on a wafer in the manufacturing of a semiconductor device. For example, in the case of forming a film on the wafer and then forming a given pattern on the thus formed film, a reticle, having an original image of a pattern, and the wafer are accurately aligned with each other, and thereafter the image or pattern on the reticle is exposed on the film. Such an alignment is performed by aligning an alignment mark on the reticle with an alignment mark on the wafer.

Such an alignment mark on the wafer is frequently formed on a scribing line. The scribing line is a cutting portion when a plurality of semiconductor devices formed on the wafer are individually cut off in pieces.

SUMMARY OF THE INVENTION

It is an object of the invention to provide a method of arranging alignment marks so as not to enlarge the width of a scribing line and clearing a center line of the scribing line, even if large alignment marks are provided on the scribing line.

To achieve the object of the invention, the invention provides a method of arranging alignment marks that comprises preparing a semiconductor wafer having scribing lines, each scribing line comprising a first area having a first width, a second area having a second width which is larger than the first width, and a third area having a third width which is larger than the first width, wherein a first alignment mark is arranged within the second area, covering the second area with a first film so that the width of the second area is substantially the same as the first width of the first area, and arranging a second alignment mark within the third area.

BRIEF DESCRIPTION OF THE DRAWINGS

FIG. 2 is a plan view showing a method of arranging alignment marks;

FIG. 3 (B) is a cross-sectional view taken along $Y_2$–$Y_2{}'$ of FIG. 2;

FIG. 3 (C) is a cross-sectional view taken along $Y_3$–$Y_3{}'$ of FIG. 2;

FIG. 5 (B) is a cross-sectional view taken along $Y_2$–$Y_2{}'$ of FIG. 4;

FIG. 5 (C) is a cross-sectional view taken along $Y_3$–$Y_3{}'$ of FIG. 4;

DETAILED DESCRIPTION OF THE INVENTION

Figure 1:
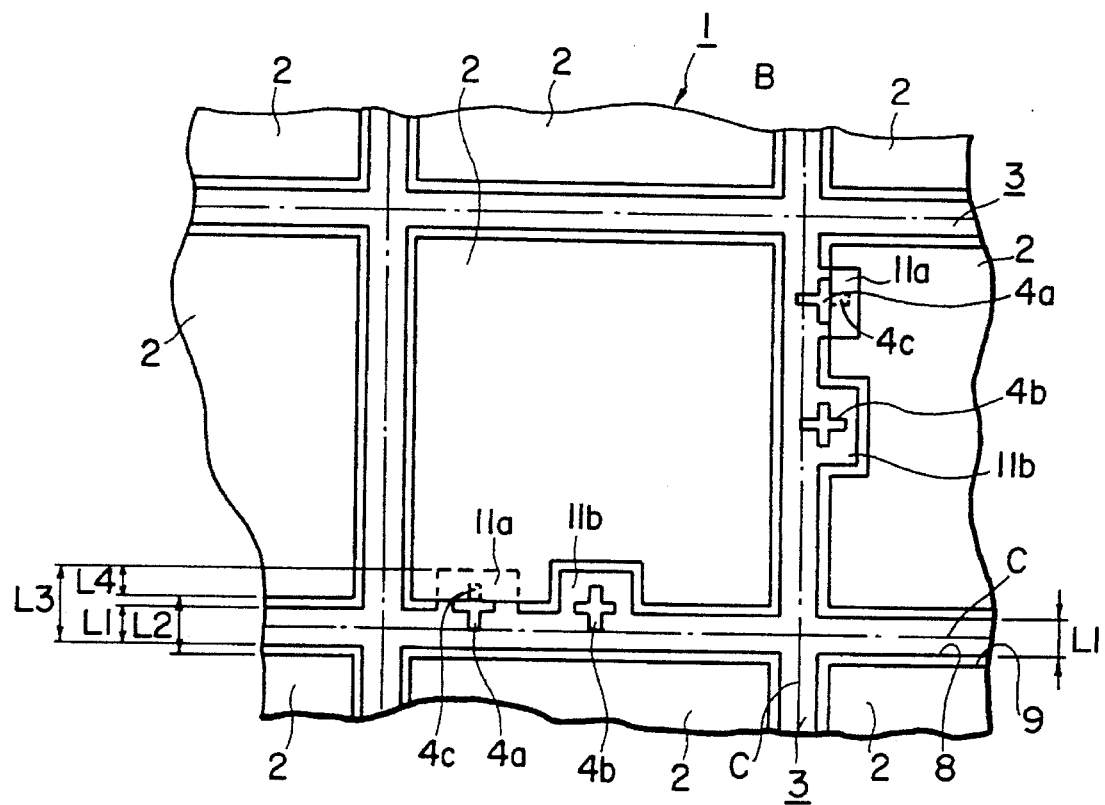
FIG. 1 is a plan view showing a part of a wafer on which semiconductor devices undergoing a manufacturing process are formed.

FIG. 1 is a plan view showing a part of a wafer on which semiconductor devices undergoing a manufacturing process are formed.

A plurality of semiconductor devices 2 are formed on a wafer 1. A plurality of scribing lines 3 are formed between structures on the wafer 1, i.e. the semiconductor devices 2 which are undergoing the manufacturing process. Center lines C of the scribing lines 3 are cut after the semiconductor devices 2 are manufactured so that the semiconductor devices 2 cut into individual pieces.

Alignment marks 4a and 4b are formed on a first scribing line 8 by the number corresponding to the number of mask alignment during the manufacturing processes of the semiconductor device 2. The alignment marks 4a and 4b are each cross-shaped and formed on respective areas 11a and 11b each having a large width L3, which is larger than a width L1 of the first scribing line 8.

A part 4c of the alignment mark 4a is arranged in a width L4 of the area 11a, and it is covered with a BPSG film B constituting the semiconductor device 2 when the alignment mark 4a is no longer used upon completion of a first alignment. That is, a second scribing line 9 is newly formed on the alignment mark 4a. At this time, a width L2 of the second scribing line 9 is set to be larger than the width L1 of the first scribing line 8. The alignment mark 4b is not covered with the BPSG film B so that it can be used in a second alignment. That is, the alignment mark 4b alone still has the function of an alignment mark. The alignment mark 4b is frequently formed at the same time as when the BPSG film B is formed.

A method of arranging the alignment marks is described in detail hereinafter with reference to FIGS. 2 to 5. Elements which are denoted with the same numerals as those of FIG. 1 represent the same elements, and the explanation thereof is omitted.

Figure 3A:
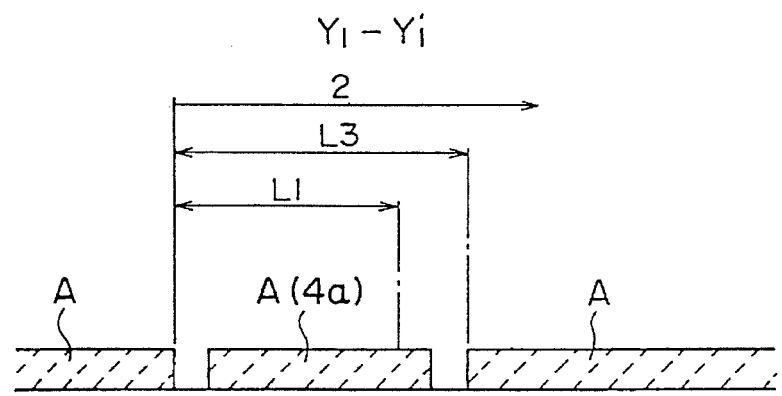
FIG. 3 (A) is a cross-sectional view taken along $Y_1$–$Y_1{}'$ of FIG. 2.
Figure 3B:
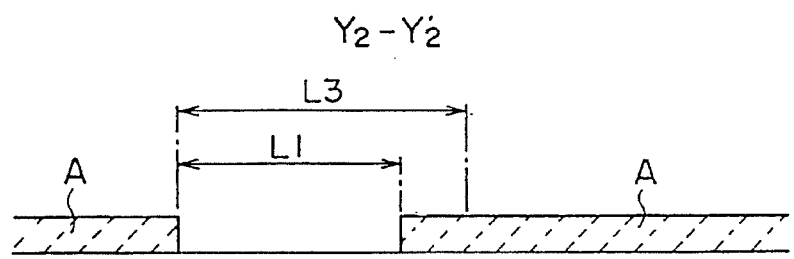
Figure 3C:
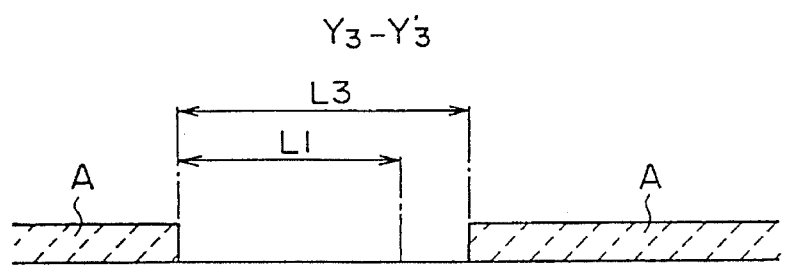

FIG. 2 is a plan view showing a method of arranging alignment marks, FIG. 3 (A) is a cross-sectional view taken along $Y_1$–$Y_1{}'$ of FIG. 2, FIG. 3 (B) is a cross-sectional view taken along $Y_2$–$Y_2{}'$ of FIG. 2, and FIG. 3 (C) is a cross-sectional view taken along $Y_3$–$Y_3{}'$ of FIG. 2.

Figure 4:
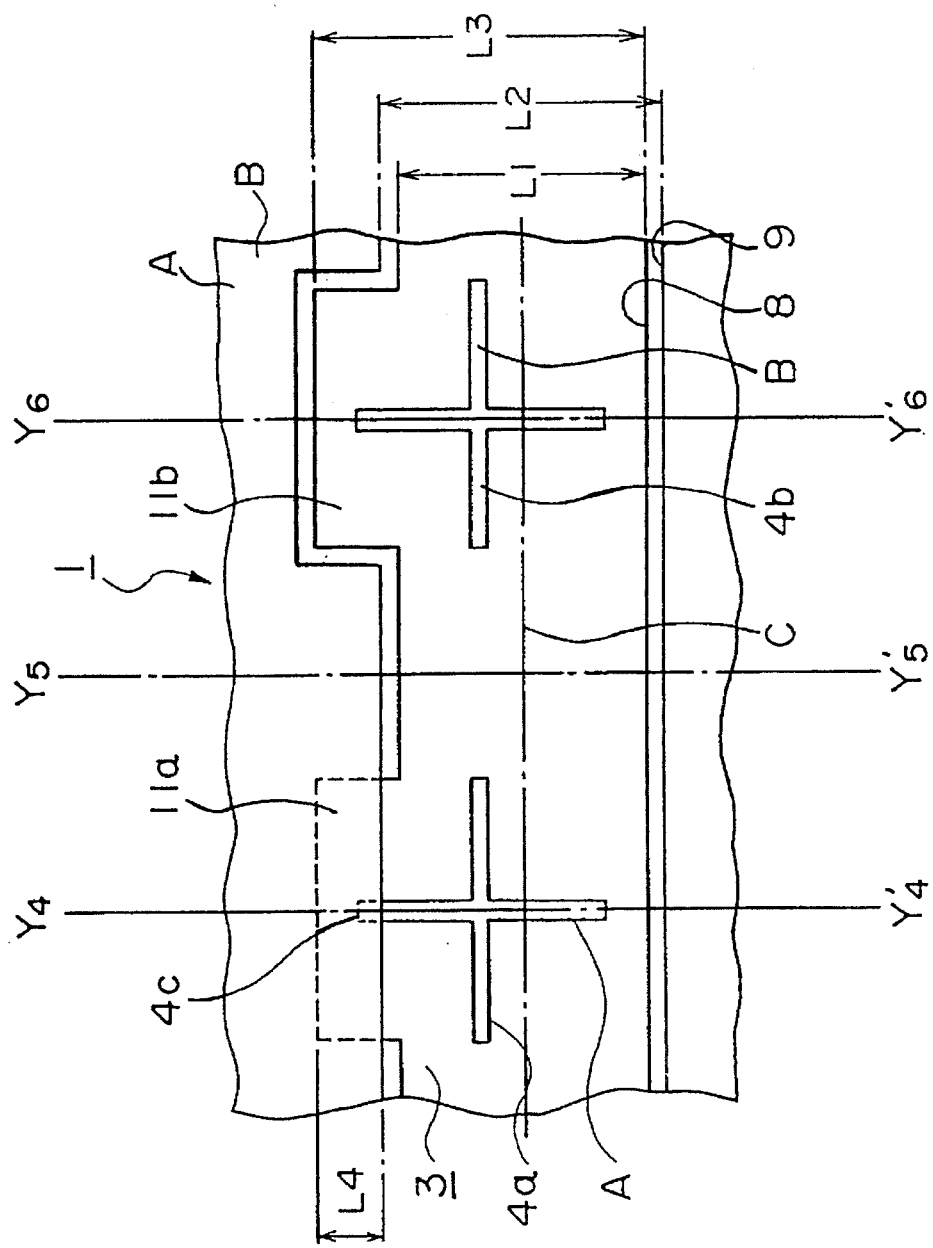
FIG. 4 is another plan view showing the method of arranging alignment marks.
Figure 5A:
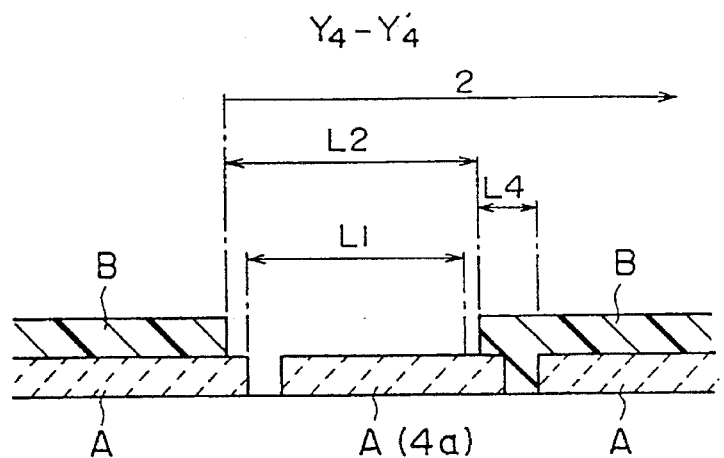
FIG. 5 (A) is a cross-sectional view taken along $Y_1$–$Y_1{}'$ of FIG. 4.
Figure 5B:
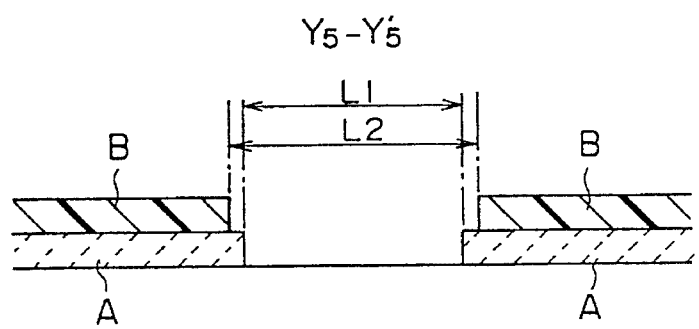

FIG. 4 is another plan view showing the method of arranging alignment marks, FIG. 5 (A) is a cross-sectional view taken along $Y_1$–$Y'$ of FIG. 4, FIG. 5 (B) is a cross-sectional view taken along $Y_2$–$Y_2{}'$ of FIG. 4, and FIG. 5 (C) is a cross-sectional view taken along $Y_3$–$Y_3{}'$ of FIG. 4.

As shown in FIGS. 2 and FIGS. 3 (A) to 3 (C), a selective oxide film A is formed on areas other than the first scribing line 8, which has the width L1 (FIG. 3(B)). There are formed areas 11a and 11b on the portion where the alignment marks 4a and 4b are formed. The areas 11a and 11b (hereinafter referred to as large areas) have a large width L3, larger than the widths of the alignment marks 4a and 4b. At this time, the alignment mark 4a is formed within the large area 11a (FIG. 3 (A)). The alignment mark 4b is not formed at this time, but the large area 11b is secured as a preset forming area of the alignment mark 4b (FIG. 3 (C)).

A mask alignment in a subsequent processes is performed with the alignment mark 4a.

The alignment mark 4a is subjected to a plurality of subsequent processes, namely, subjected to processes several times, such as an electrode forming process having an etching process. As a result, the alignment mark 4a is gradually thinned in its thickness and is roughened on its surface. If the mask alignment is continued using such an alignment mark 4a, an alignment accuracy is deteriorated.

Figure 5C:
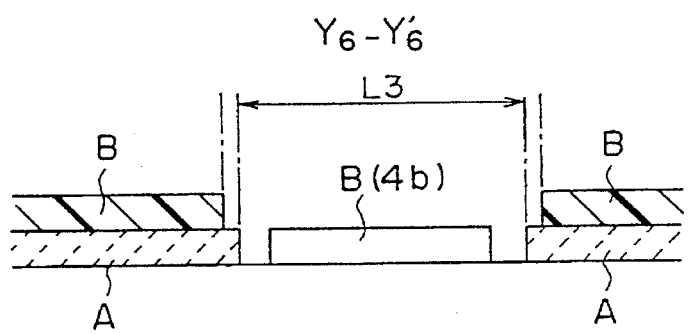

As shown in FIGS. 4 and 5, the alignment mark 4b is formed within the large area 11b at the time when the BPSG film B is used for insulating between an electrode and a wiring (FIG. 5C). At this time, the width L2 of the second scribing line 9 is larger than the width L1 of the first scribing line 8 (FIG. 5 (B). Further, since the alignment mark 4a has already completed its function and is no longer used, the width L4 within the large area 11a is covered with the BPSG film B (FIG. 5 (A)). That is, the part 4c of the alignment mark 4a is covered with the BPSG film B. Accordingly, the alignment mark 4a loses its function as an alignment mark.

The alignment mark 4b is used for the mask alignment in the subsequent processes.

Accordingly, the method of arranging the alignment marks comprises (a) providing the large areas 11a and 11b which partially widen the first scribing line 8, (b) performing the mask alignment using the alignment mark 4a which is formed within the large area 11a among of the large areas 11a and 11b, (c) thereafter, when the alignment mark 4a is no longer used, forming a subsequent alignment mark 4b within the large area 11b and at the same time covering part of the alignment mark 4a with the BPSG film B.

Further, the alignment mark 4b and the alignment marks formed thereafter are likewise partially covered with the BPSG film when they are no longer used. Accordingly, the large areas 11a and 11b, which partially widen the scribing lines, are not present when the final process is completed so that the scribing lines each having a given width, alone remains on the wafer.

Accordingly, it is possible to prevent the center lines of the scribing lines from being unclear when the semiconductor devices 2 are cut into individual pieces.

Furthermore, according to the present method of arranging the alignment marks, the scribing lines, each having a given width, alone remain on the wafer irrespective of the size of the alignment mark when the final process is completed. Accordingly, the number of semiconductor devices 2 that can be formed on a piece of wafer 1 is increased as compared with the case where a given width of the scribing line is set large beforehand depending on the sizes of the alignment marks.

According to the preferred embodiment of the present invention, the alignment marks 4a and 4b are formed of the selective oxide film A and the BPSG film B, respectively, but they can also be formed of an electrode material such as polysilicon.

Although the alignment marks 4a and 4b are cross-shaped, they may be V-shaped or rod-shaped, or the like.

As described in detail above, according to the present method of arranging the alignment marks, since a part of the alignment mark is covered with a film when the alignment mark is no longer used, the widened portion is scarcely present along the scribing line, and the scribing line having the given width alone remains when the final process is completed. Accordingly, the center line of the scribing line is made clear.

Figure 6:
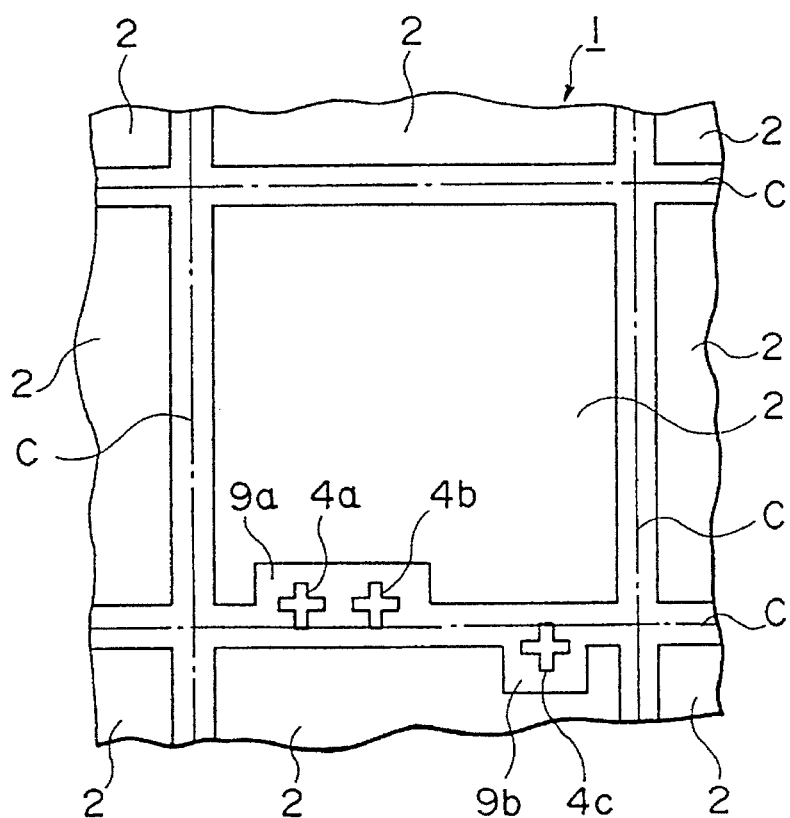
FIG. 6 is a plan view showing a part of another wafer on which a semiconductor device undergoing a manufacturing process, is formed.

That is, even if the scribing lines are appropriately widened merely at the portions necessary for providing the alignment marks, many widened portions present on the scribing line when the final process is completed makes the center lines of the scribing lines unclear (FIG. 6). However, according to the present method of arranging alignment marks, it is possible to prevent the center lines of the scribing lines from being unclear.

It is possible to increase the number of semiconductor devices 2 to be formed on a piece of wafer 1 as compared with the case where the given widths of the scribing lines are set large beforehand in dependence on the sizes of the alignment marks.

Figure 7:
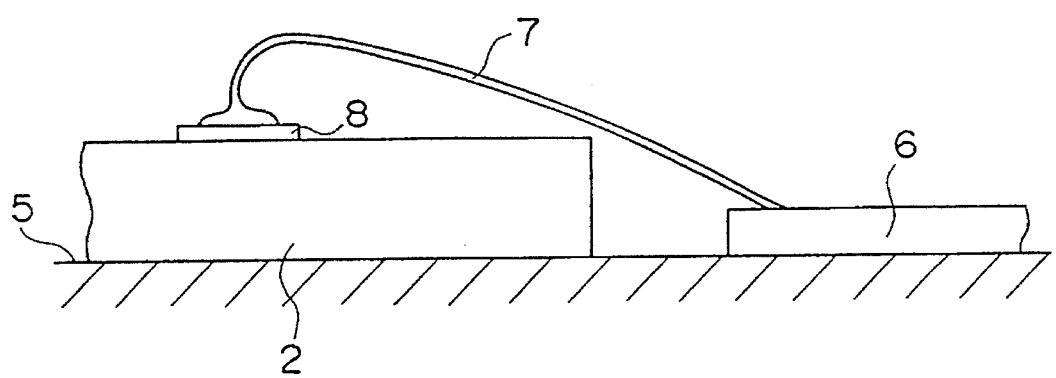
FIG. 7 is a view showing a state where the semiconductor device is connected to a lead by a wire.

The semiconductor device 2 is attached to a die pad 5 after it is cut off from the wafer 1, as shown in FIG. 7. Thereafter, the semiconductor device 2 is connected to a lead 6 by a wire 7 such as Au, etc. by way of a pad 18. If the given width of the scribing line is set large, in this connecting process, there a problem occurs in that the wire 7 contacts the semiconductor device 2, as can be seen by FIGS. 1 and 5, for example, the majority of the areas such as 11a are covered by the film B such that the width of the areas becomes nearly the width of the scribing line.

However, according to the present method of arranging alignment marks, since the scribing line having a desired width can be formed irrespective of the size of the alignment mark, it is possible to solve the problem where the wire 7 contacts the semiconductor device 2.

What is claimed is:

1. A method of arranging alignment marks, comprising the steps of:

forming a plurality of structures on a semiconductor wafer with scribing lines between said plurality of structures, each of said scribing lines comprising a first area having a first width, a second area having a second width larger than said first width and a third area having a third width larger than said first width, and forming a first alignment mark arranged within said second area;

covering said second area with a first film such that said second width of said second area is reduced toward said first width of said first area; and arranging a second alignment mark within said third area.

2. The method of claim 1, wherein said second width is substantially the same as said third width after said step of forming and before said step of covering.

3. The method of claim 1, wherein said steps of covering said second area with said first film and arranging said second alignment mark within said third area are performed at the same time.

4. The method of claim 3, wherein said step of forming said first alignment mark comprises forming said first alignment mark with an oxide film, and said steps of covering said second area with said first film and arranging said second alignment mark within said third area further comprise forming said first film and said second alignment mark with a BPSG film.

5. The method of claim 1, wherein said first alignment mark is partially covered by said first film in said step of covering said second area.

6. A method of arranging alignment marks used in the formation of semiconductor devices on a wafer on scribing lines separating the semiconductor devices being formed, the scribing lines forming cutting lines for cutting and separating the individual semiconductor devices from each other after formation, and the alignment marks having widths greater than the widths of the scribing lines, said method comprising the steps of:

forming an alignment mark within an area along one of the scribing lines having a width greater than the width of the one of the scribing lines;

covering a part of the area in which the alignment mark was formed after the alignment mark has been used in the formation of semiconductor devices so that the area is reduced in width toward the width of the one of the scribing lines; and arranging a new alignment mark within another area along the one of the scribing lines having a width greater than the width of the one of the scribing lines.

7. The method of claim 6, wherein said steps of covering and arranging a new alignment mark are carried out at the same time.

8. The method of claim 6, wherein said step of covering comprises covering the majority of the area in which the alignment mark was found.

9. A method of arranging alignment marks, comprising the steps of:

forming a plurality of structures on a semiconductor wafer with scribing lines between said plurality of structures, each of said scribing lines comprising a first area having a first width, a second area having a second width larger than said first width and a third area having a third width larger than said first width, and forming a first alignment mark arranged within said second area;

covering said second area with a first film such that said second width of said second area becomes nearly said first width of said first area; and arranging a second alignment mark within said third area.

10. The method of claim 1, wherein in said step of covering, said scribing lines are not covered by said first film.

11. The method of claim 6, wherein in said step of covering, said scribing lines are not covered by said first film.

12. The method of claim 9, wherein in said step of covering, said scribing lines are not covered by said first film.

* * * * *